(12) United States Patent
Moon et al.

(10) Patent No.: US 6,583,507 B1
(45) Date of Patent: Jun. 24, 2003

(54) BARRIER FOR CAPACITOR OVER PLUG STRUCTURES

(76) Inventors: Bum Ki Moon, Shurosu Senzoka B, 6-30-9, Hatanodai, Shinagawa-ku, Tokyo, 142-0064 (JP); Nicolas Nagel, 75-2, Nishinoyacho, Naka-ku, Yokohama-shi, Kanagawa-ken 231-0844 (JP); Gerhard Adolf Beitel, #204-1-2-30 Yukinoshita, Kamakura-shi, Kanagawa-ken 248-0005 (JP)

(*) Notice: Subject to any disclaimer, the term of this patent is extended or adjusted under 35 U.S.C. 154(b) by 0 days.

(21) Appl. No.: 10/134,071

(22) Filed: Apr. 26, 2002

(51) Int. Cl.[7] .................... H01L 23/48; H01L 23/52; H01L 29/40
(52) U.S. Cl. ........................ 257/751; 257/295
(58) Field of Search ..................... 257/751, 750, 257/758, 295, 303, 307

(56) References Cited

U.S. PATENT DOCUMENTS

| | | | |
|---|---|---|---|
| 5,744,832 A | * | 4/1998 | Wolters et al. |
| 6,046,469 A | * | 4/2000 | Yamazaki et al. |
| 6,107,136 A | * | 8/2000 | Melnick et al. |
| 6,465,828 B2 | * | 10/2002 | Agarwal |

* cited by examiner

Primary Examiner—Sheila V. Clark
(74) Attorney, Agent, or Firm—Dexter Chin

(57) ABSTRACT

An improved barrier stack for reducing plug oxidation in capacitor-over-plug structures is disclosed. The barrier stack is formed on a non-conductive adhesion layer of titanium oxide. The barrier stack includes first and second barrier layers wherein the second barrier layer covers the top surface and sidewalls of the first barrier layer. In one embodiment, the first barrier layer comprises Ir and the second barrier layer comprises $IrO_x$. Above the barrier stack is formed a capacitor.

24 Claims, 8 Drawing Sheets

BARRIER FOR CAPACITOR OVER PLUG STRUCTURES

FIELD OF THE INVENTION

The present invention relates to a barrier stack used in, for example, integrated circuits (ICs) which reduces diffusion of atoms or molecules, such as oxygen. More particularly, the barrier stack reduces oxidation of the plug in capacitor over plug structures.

BACKGROUND OF THE INVENTION

Memory ICs comprise a plurality of memory cells interconnected by bitlines and wordlines. A memory cell includes a transistor coupled to a capacitor for storage of a bit of information. To realize high density memory ICs, the memory cells employ a capacitor-over-plug (COP) structure, as shown in FIG. 1. The structure includes a capacitor 140 having a dielectric layer 146 located between first and second electrodes 141 and 142. The capacitor is coupled to a conductive plug 170.

Typically, a high temperature anneal in an oxygen ($O_2$) ambient is required to improve the properties of the dielectric layer, particularly for high k dielectric and ferroelectric materials. Additionally, another anneal in $O_2$ is required to repair the damage caused by etching of the contact hole 165. Typically, the anneals are performed at 700° C. for 1 hour. During the anneals, $O_2$ diffuses through the capacitor and oxidizes the plug. This can lead to performance degradation and, in some cases, failures as a result of increased plug resistivity or electrical open connections.

To prevent diffusion of oxygen through the capacitor, a barrier layer 187 formed from iridium is provided between the lower electrode and the plug. Iridium (Ir) is used due to its good barrier properties against $O_2$. Since Ir has a tendency to delaminate from the ILD layer (e.g., silicon dioxide or silicon nitride), a titanium nitride layer 182 is provided between the layers to promote adhesion. However, as shown, sidewalls of the barrier and adhesion layers are exposed. Oxygen can diffuse through the exposed sidewalls and horizontally along the interfaces between the adhesion, barrier, and ILD, oxidizing the adhesion layer, in some cases, the plug.

From the foregoing discussion, it is desirable to provide an improved barrier layer for reducing oxidation of the plug in a capacitor over plug structure.

SUMMARY OF THE INVENTION

The invention relates generally to the formation of capacitors over plug structures. In one embodiment, an improved barrier stack which reduces oxidation of the plug is described. The barrier stack is located between an adhesion layer and a capacitor to reduce oxidation of the plug.

In one embodiment, a non-conductive adhesion layer is provided on an interlevel dielectric layer except where the plug is located. The adhesion layer, in one embodiment, comprises titanium oxide. First and second conductive barrier layers are provided between the adhesion layer and the capacitor. The first barrier layer is disposed between the second barrier layer and adhesion layer. The second barrier layer covers the top surface and sidewalls of the first barrier layer. In one embodiment, the first barrier layer comprises Ir and the second barrier layer comprises $IrO_x$. The second barrier layer inhibits the diffusion of, for example, $O_2$ through the sidewalls of the first barrier layer and interface of the adhesion and first barrier layer, thereby reducing or avoiding plug oxidation.

DETAILED DESCRIPTION THE INVENTION

The invention relates to improved barrier stacks for inhibiting diffusion of atoms or molecules, such as $O_2$. Such barrier stacks are particularly useful for capacitor over plug structures of memory cells. In one embodiment, the barrier stack is employed in a ferroelectric capacitor. The barrier stack can also be used in other types of capacitors, such as high k dielectric capacitors.

Figure 1:
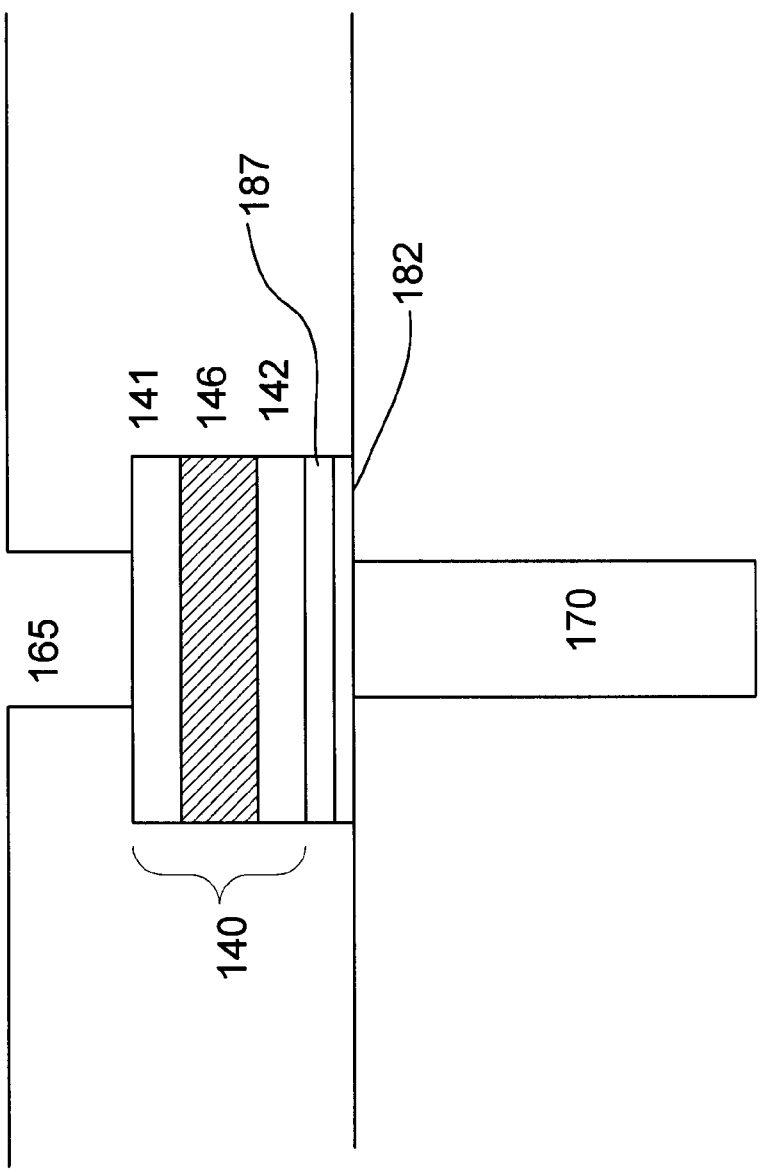
FIG. 1 shows a cross-sectional view of a capacitor on plug structure.
Figure 2:
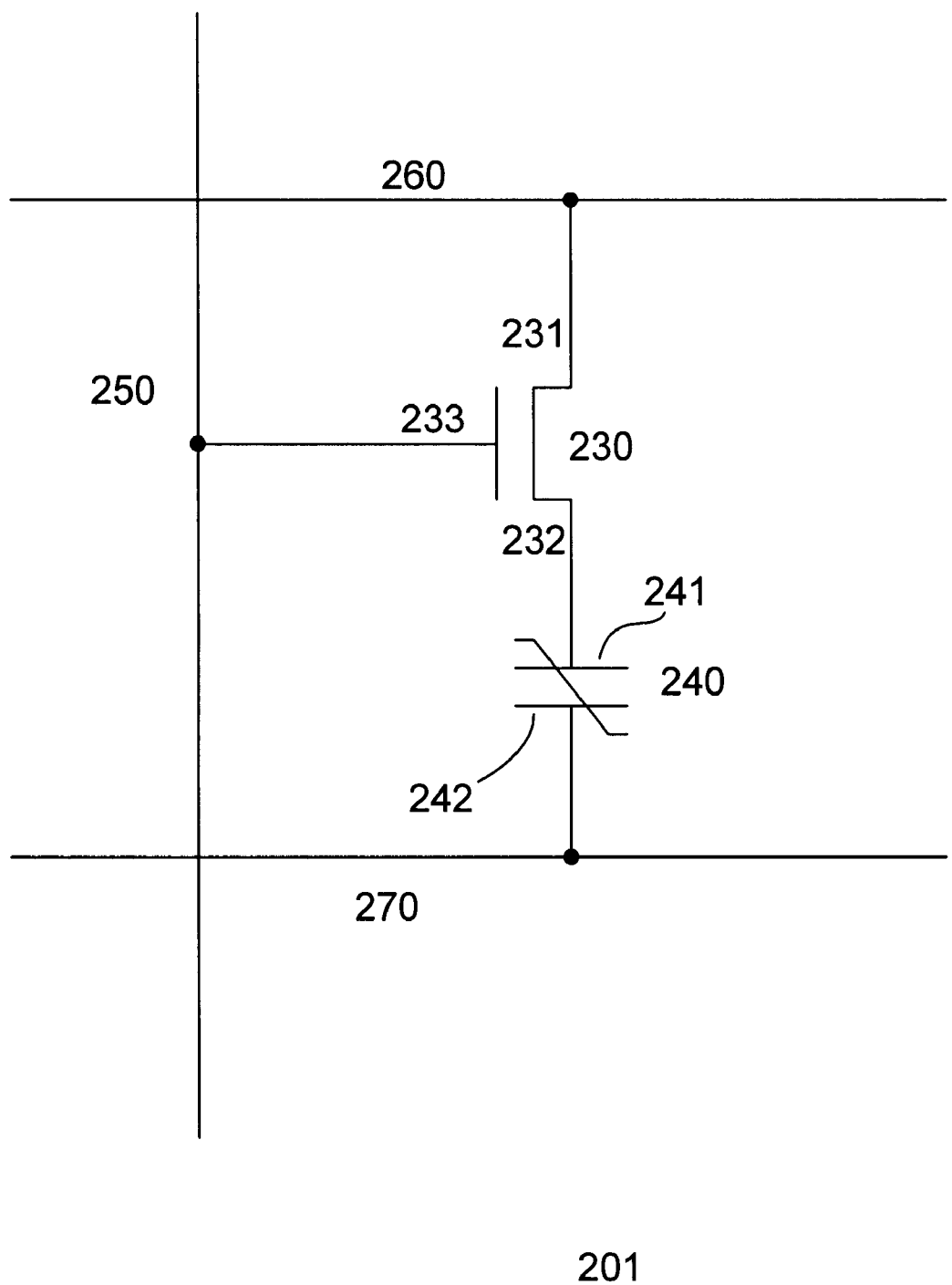
FIG. 2 shows a ferroelectric memory cell.

FIG. 2 shows a ferroelectric memory cell 201 with a transistor 230 and a capacitor 240. A second terminal 232 of the transistor is coupled to a first electrode 241 of the capacitor. Gate 233 and first terminal 231 of the transistor are respectively coupled to a wordline 250 and bitline 260. Coupled to a second electrode 242 of the capacitor is a plateline 270. The capacitor uses the hysteresis polarization characteristic of the ferroelectric material for storing information. The logic value stored in the memory cell depends on the polarization of the capacitor. To change the polarization, a voltage which is greater than the switching voltage (coercive voltage) needs to be applied across the capacitor's electrodes via the bitline and plateline. The polarization of the capacitor depends on the polarity of the voltage applied. An advantage of the ferroelectric capacitor is that it retains its polarization state after power is removed, resulting in a non-volatile memory cell.

Figure 3:
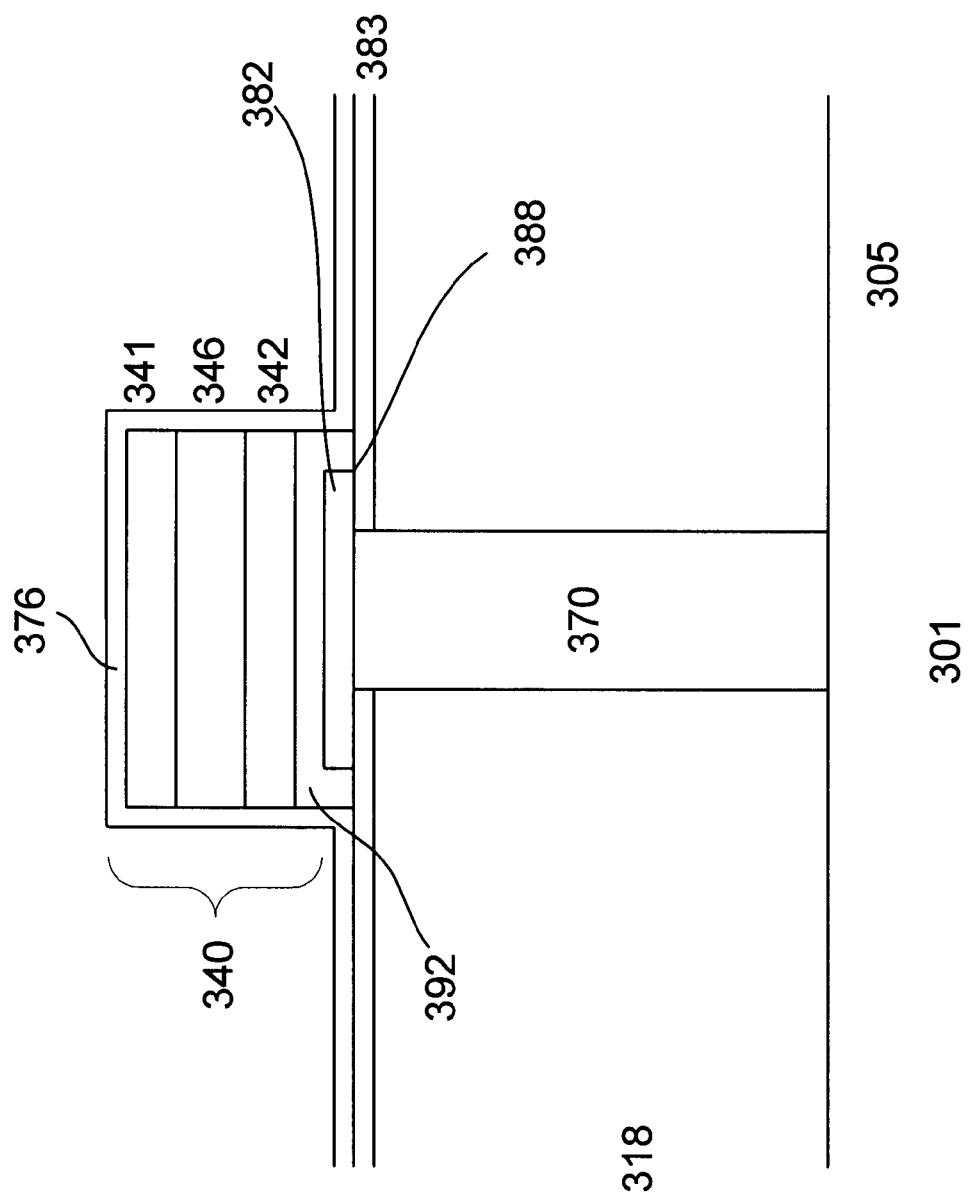
FIGS. 3–4 show different embodiments of the invention.

Referring to FIG. 3, a ferroelectric COP structure 301 in accordance with one embodiment of the invention is shown. The COP structure is formed on a semiconductor substrate 305 and insulated by an interlevel dielectric (ILD) layer 318. The ILD layer, for example, comprises silicon oxide ($SiO_2$). Other types of dielectric material, such as silicon nitride or doped silicate glass are also useful. The COP structure comprises a capacitor 340 having a ferroelectric layer 346 such as lead zirconate titanate (PZT). Strontium bismuth tantalum (SBT) or other types of ferroelectric materials are also useful. The ferroelectric layer is located between first and second electrodes 341 and 342. The electrodes, for example, comprise a noble metal such as platinum. Other types of conductive materials, for example, $SrRuO_3$, $La_{0.5}Sr_{0.5}O_3$, $LaNiO_3$, or $YBa_2Cu_3O_7$, are also useful. The upper and lower electrodes can be formed from the same or different materials.

In alternative embodiments, the COP structure comprises a non-ferroelectric capacitor having a dielelectric layer between first and second electrodes. The dielectric layer, for example, comprises a high k dielectric layer, while the electrodes comprise conductive material such as Ru. Other types of dielectric materials or conductive materials can be used for the dielectric layer and electrodes.

A plug 370 is provided, electrically coupling the capacitor to, for example, a diffusion region of a transistor. The plug is formed from a conductive material such as polysilicon (poly-Si) or tungsten (W). Other types of conductive materials are also useful. For poly-Si plugs, a pre-layer comprising silicide is typically provided on the ILD between the electrode and the plug. The gate of the transistor is coupled to a wordline and the other diffusion region is coupled to the bitline. The upper electrode is coupled to the plateline. A barrier layer 382 is provided beneath the lower electrode of the capacitor to inhibit diffuison of $O_2$, protecting the plug 370 from oxidation. In one embodiment, the barrier layer comprises a non-oxidizing conductive material which exhibits good barrier characteristics against $O_2$. The barrier material, in one embodiment, comprises Ir. Other non-oxidizing conductive materials with good barrier properties against $O_2$, such as Pd, Rh or Hf, are also useful.

To promote adhesion between the barrier layer and ILD, an adhesion layer 383 is provided. The material of the adhesion layer should be stable, exhibit good barrier properties, and have strong bonding properties with the barrier layer. In one embodiment, the adhesion layer comprises a non-conductive oxide. Preferably, the adhesion layer comprises titanium oxide ($TiO_2$). Other materials, such as cerium oxide ($CeO_2$), zirconium oxide ($ZrO_2$), or hafnium oxide ($HfO_2$), are also useful. Since $TiO_2$ is non-conductive, it can remain on the ILD layer except where the plug is located. This advantageously eliminates the interface between the ILD and adhesion layer as a diffusion path for $O_2$.

A second barrier layer 392 is provided above the first barrier layer, forming a barrier stack. In accordance with the invention, the second barrier layer covers the surface and sidewalls of the first barrier layer. The second barrier should have good barrier properties and bonding properties with the adhesion layer. In one embodiment, the second barrier layer comprises iridium oxide ($IrO_x$). The second barrier layer, by completely covering the first barrier layer, protects the diffusion of $O_2$ or other oxidizing gases through the sidewalls of the first barrier layer as well as along the interface of the first barrier and adhesion layers.

In one embodiment, a non-conductive encapsulation layer 376 covers the capacitor. The encapsulation layer serves to prevent oxidation of the capacitor layers during recovery annealing. In one embodiment, the encapsulation layer comprises aluminum oxide ($Al_2O_3$) or silicon nitride (SiN). Other types of non-conductive materials, such as $CeO_2$, $ZrO_2$ and $HfO_2$, can also be used.

Figure 4:
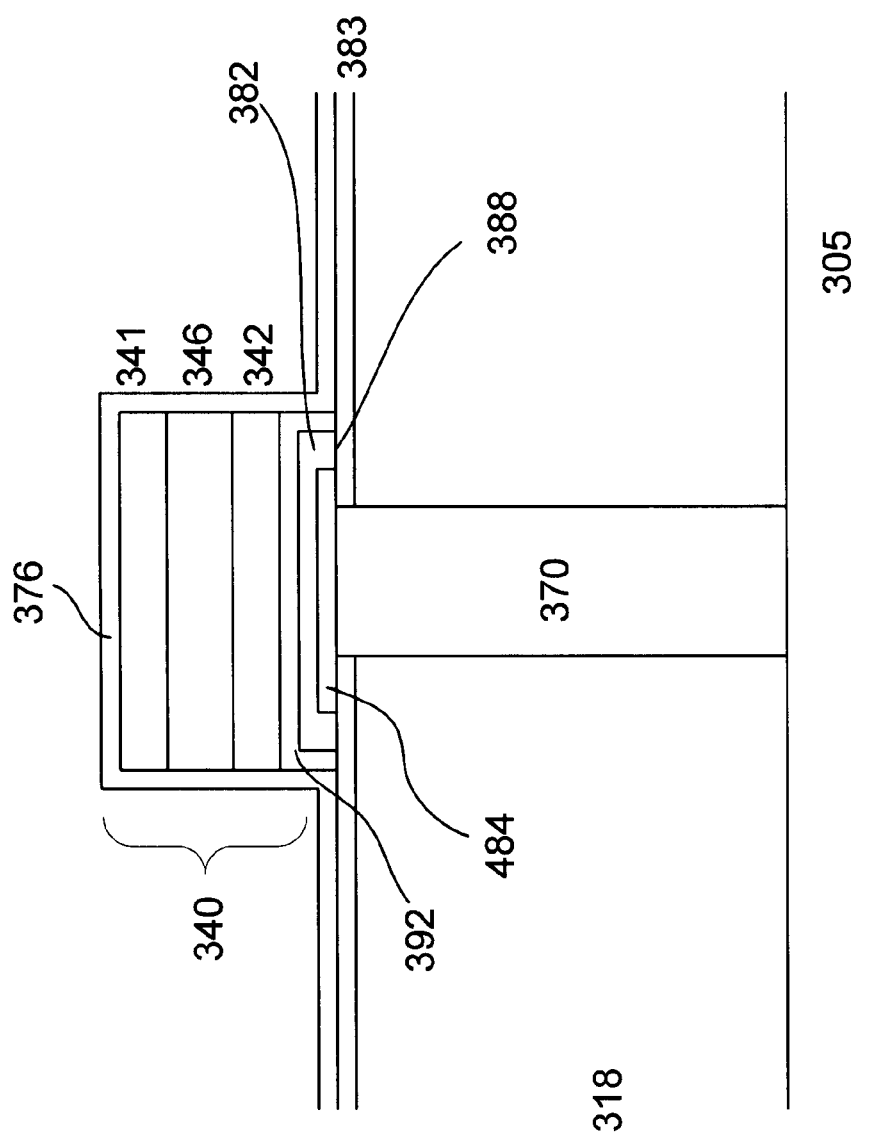

In an alternative embodiment shown in FIG. 4, an additional barrier layer 484 is provided between the first barrier layer and adhesion layer. The additional barrier layer, in one embodiment, comprises a conductive material which improves adhesion between the first barrier and adhesion layers. Additionally, the barrier layer 484 serves to inhibit diffusion of plug material (e.g., Si) upwards into the capacitor. As shown, the first barrier layer covers the sidewalls and surface of the additional barrier layer. Providing first barrier layer which covers only the surface of the additional barrier layer is also useful. In one embodiment, the first additional barrier layer comprises titanium. Other materials, such as TiN, TaN, TaSiN, or TiAlN, are also useful.

Although the COP structure is shown with a single capacitor, other types of COP structures are also useful. For example, the COP structure can include two capacitors, such as those used in chained memory architectures. Chained memory architectures are described in, for example, Takashima et al., "High Density Chain Ferroelectric Random Access Memory (Chain FRAM)", IEEE Jrnl. of Solid State Circuits, vol.33, pp.787–792, May 1998, which is herein incorporated by reference for all purposes.

Figure 5:
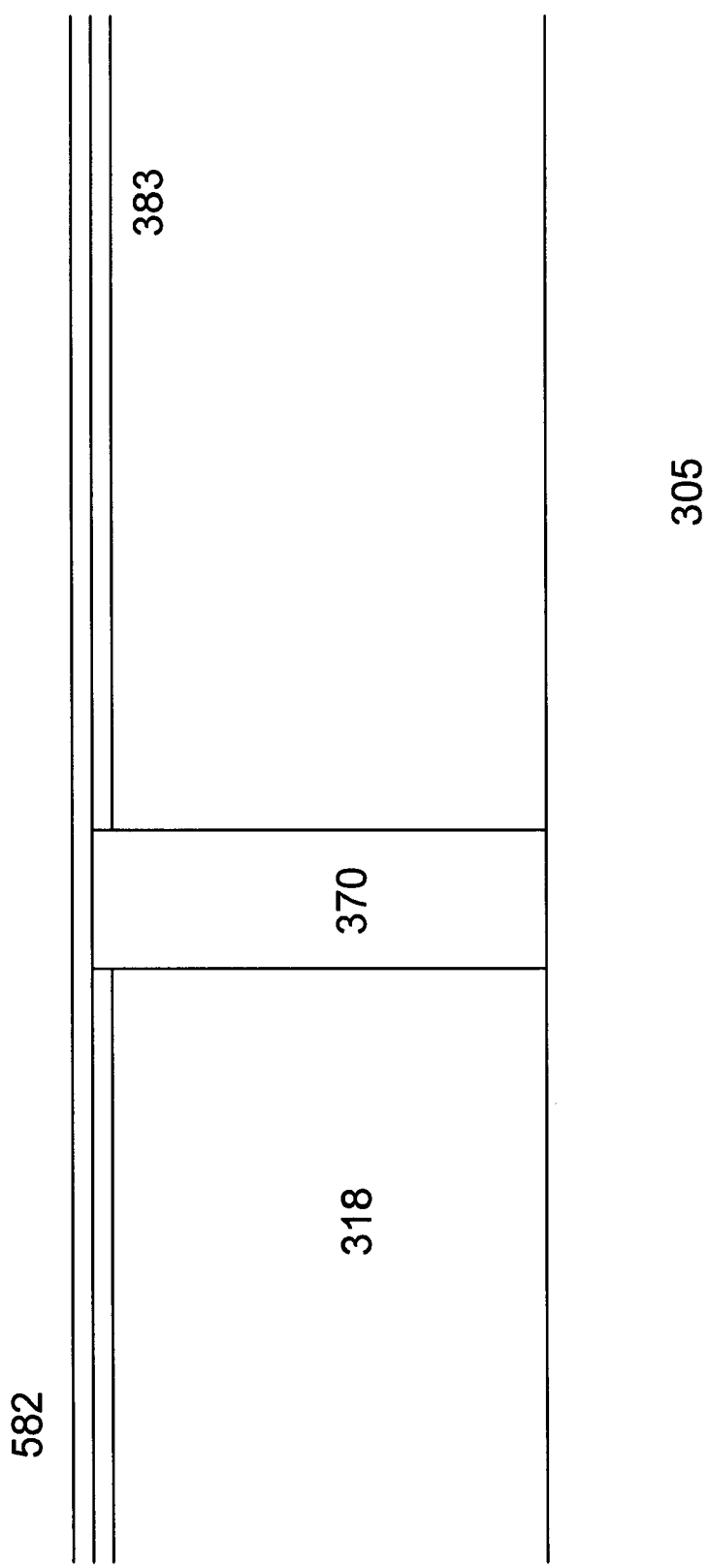
FIGS. 5–8 show a process for fabricating a capacitor over plug in accordance with one embodiment of the invention.

FIGS. 5–8 show a process for fabricating a capacitor in accordance with one embodiment. Referring to FIG. 5, a substrate 305 is provided. The substrate comprises a semiconductor substrate such as silicon. Other types of substrates, such as silicon-on-insulator, can also be used. The substrate is prepared with an ILD 318 formed thereon. The ILD, for example, comprises $SiO_2$. Other types of dielectric materials, such as SiN, are also useful. Below the ILD is, for example, a transistor having a gate and first and second diffusion regions.

A non-conductive adhesion layer 383 is deposited on the ILD. The non-conductive adhesion layer promotes adhesion between a subsequently formed barrier to the ILD. Further, the adhesion layer is selected to provide a strong bond between it and the subsequently formed barrier material to prevent or reduce diffusion of $O_2$ through the interface between the layers. In one embodiment, the non-conductive adhesion layer comprises $TiO_2$. Alternatively, the non-conductive adhesion layer comprises $CeO_2$, $ZrO_2$, $HfO_2$ or other types of non-conductive adhesion layer. The adhesion layer is formed by, for example, CVD, PVD, spin-coating or other known techniques.

After the adhesion layer is formed, a contact opening is formed, exposing one of the diffusion regions of the cell transistor. The contact opening is formed using, for example, conventional mask and etch techniques. A conductive material, such as W or poly-Si is then deposited, filling the contact opening and covering the surface of the ILD. Other types of conductive materials are also useful. The surface of the substrate is planarized by chemical mechanical polishing (CMP). The adhesion layer serves as an etch stop for the CMP, removing excess conductive material to form a plug 370 having a coplanar surface with the adhesion layer. For applications using a poly-Si plug, a silicide pre-layer is formed on the ILD prior to depositing the adhesion layer.

A barrier layer 582 is then deposited over the adhesion layer. The barrier layer comprises a conductive material which exhibits good barrier properties. As previously discussed, the barrier material should form a strong bond with the adhesion layer to prevent or reduce lateral diffusion of $O_2$ along the interface of the layers. In one embodiment, the barrier layer comprises Ir. Other conductive materials having good barrier properties and forming a strong bond with the adhesion layer, such as Pd, Rh and Hf, can also be used. Conventional deposition techniques, such as sputtering can be used to form the barrier layer.

Figure 6:
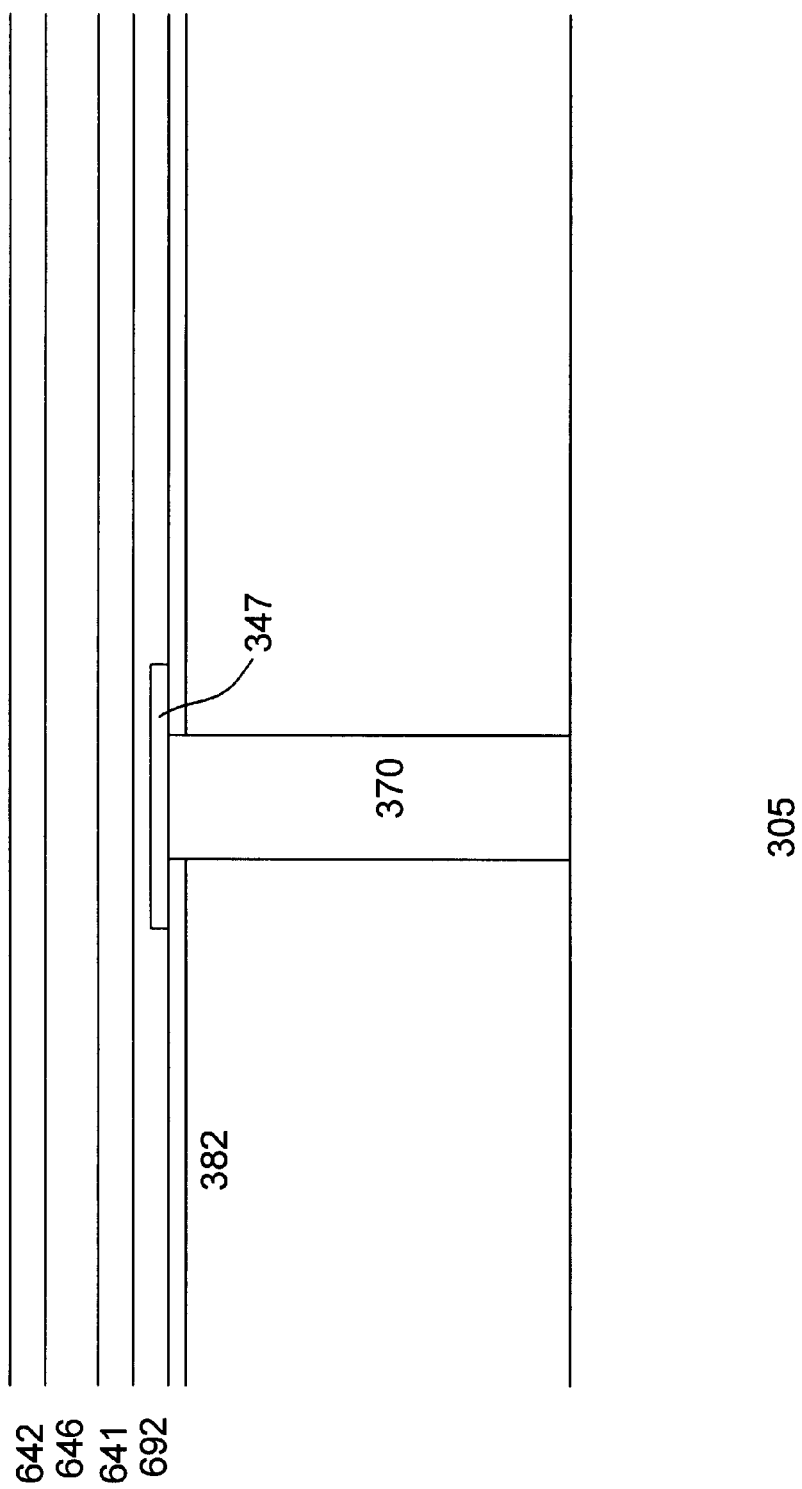

Referring to FIG. 6, the barrier layer is patterned to form a barrier 347, contacting the upper surface of the plug. If a silicide layer is provided, both the barrier and silicide layers are patterned together. Conventional masking and etching processes are employed to pattern the barrier layer.

A second barrier layer is then deposited over the substrate, covering the barrier and adhesion layer. In one embodiment, the second barrier layer comprises a conductive oxide. Preferably, the second barrier layer comprises $IrO_x$. Alternatively, the second barrier layer comprises other types of conductive oxide with good barrier properties as well as exhibiting strong bonding properties with the adhesion layer.

The process continues to form the layers of the capacitor over the barrier oxide. In one embodiment, the process continues to form a ferroelectric capacitor. Forming other types of capacitors are also useful. The process includes sequentially forming first conductive electrode 641, ferroelectric 646, and second electrode 642 layers. The electrodes, for example, comprise a noble metal such as platinum. Other types of conductive materials can also be used. In one embodiment, the ferroelectric material comprises PZT. Other types of ferroelectric materials, such as SBT, are also useful. Various known techniques can be used to form the different layers of the capacitor. Such techniques are described in, for example, CVD, PVD and spin-coating, which are herein incorporated by reference for all purposes.

For applications using PZT, strontium ruthineum oxide (SRO) layers can be formed between the ferroelectric layer and the electrodes to enhance the properties of the ferroelectric layer.

Figure 7:
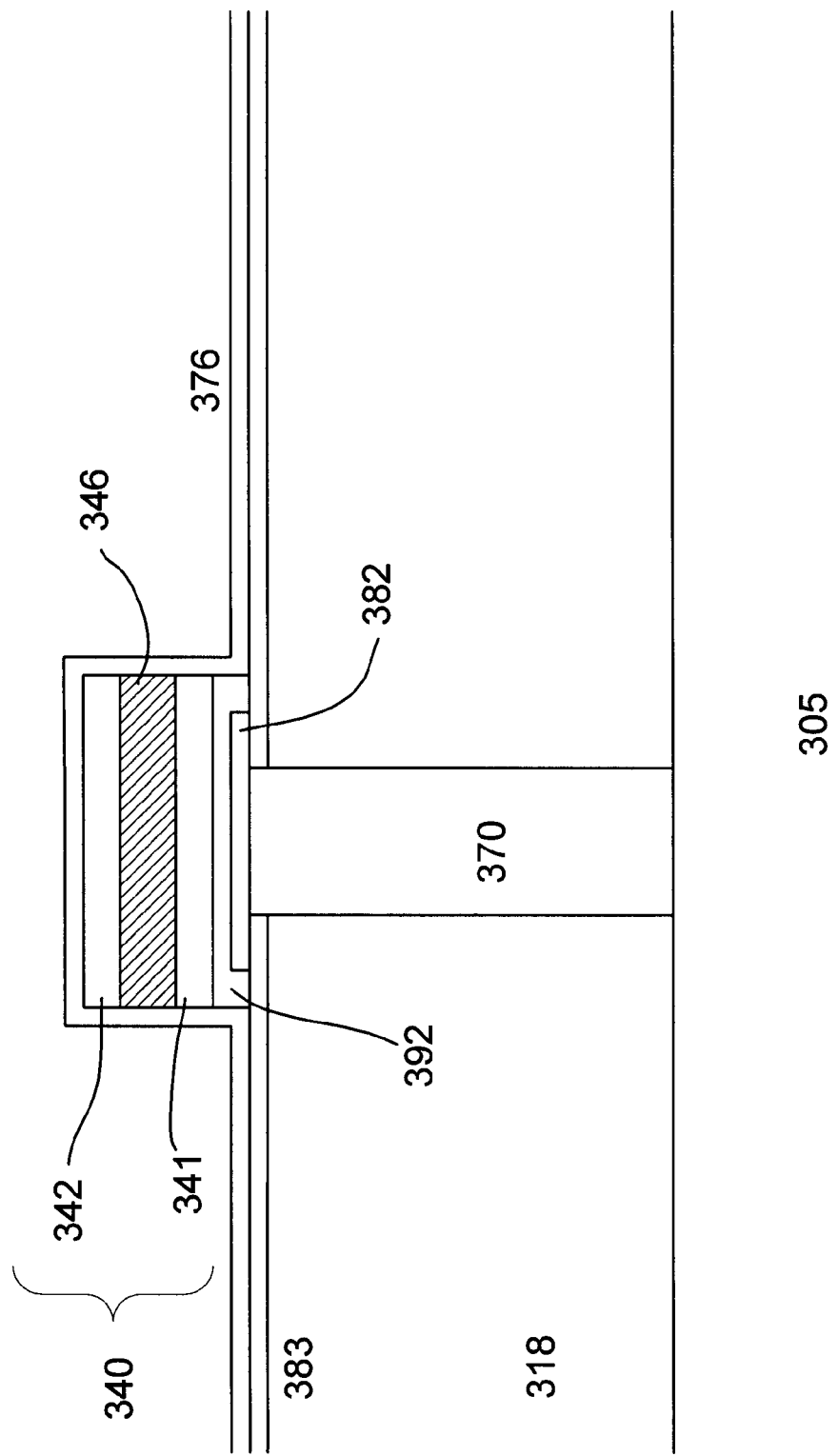

Referring to FIG. 7, the second barrier layer and the various layers of the capacitor are patterned to form the capacitor 340. The layers are patterned using, for example, conventional mask and etch techniques. As shown, the second barrier layer 392 covers the first barrier layer 382, including its sidewalls.

After the capacitor is formed, an encapsulation layer is deposited on the substrate. The encapsulation layer 376 covers the capacitor structure. In one embodiment the encapsulation layer comprises $Al_3O_2$. Other types of materials which are good insulators and having good barrier properties, such as SiN or $TiO_2$, are also useful.

Figure 8:
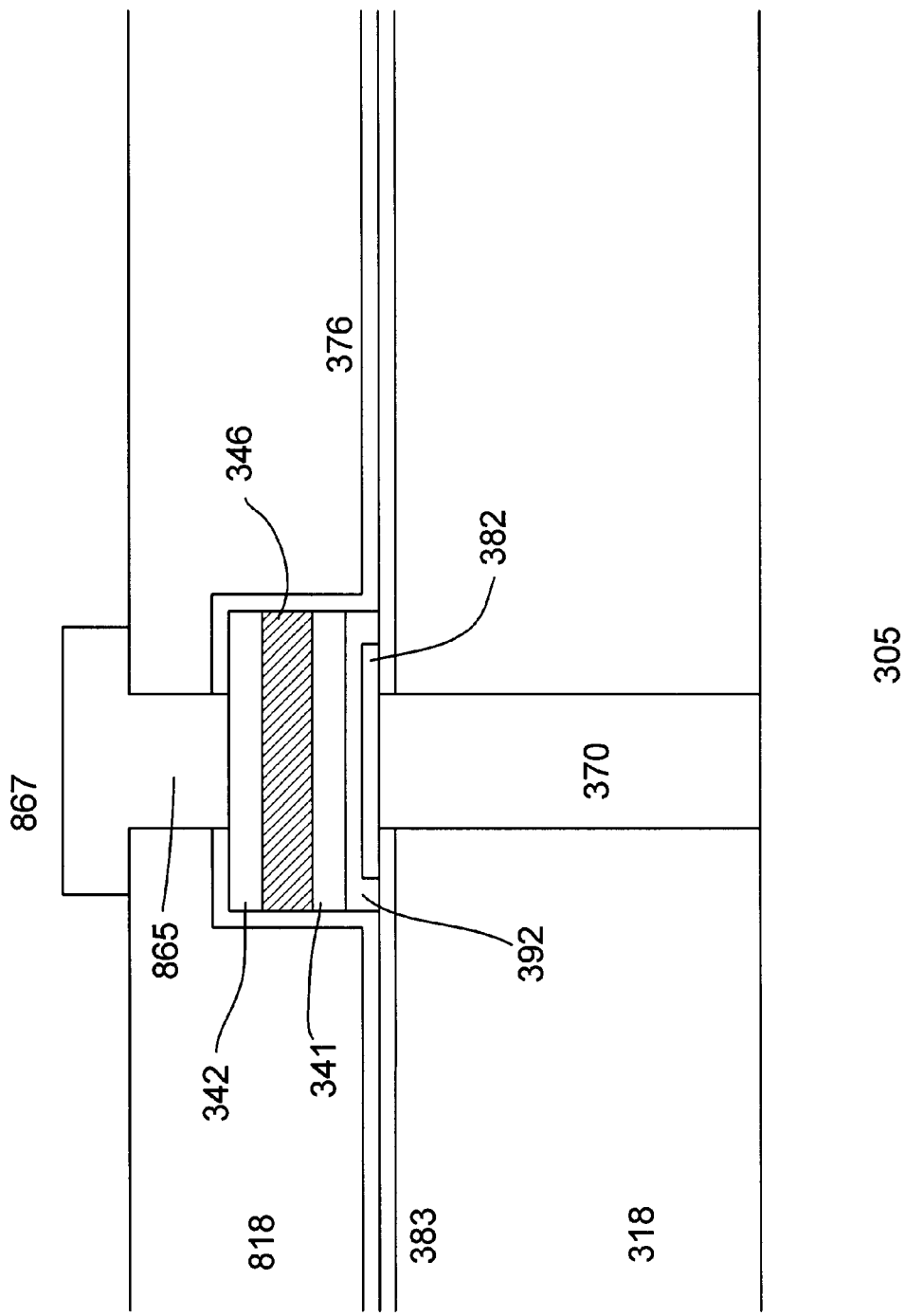

Referring to FIG. 8, an ILD layer 818 is deposited on the substrate covering the capacitor structure. The ILD, for example, comprises $SiO_2$. Other types of dielectric materials, such as SiN, doped silicate glass, or spin-on glass, can also be used. The surface of the ILD layer is planaraized by, for example, CMP. Other techniques such as reflowing can also be used, depending on the material used. A contact 865 is then formed in the dielectric layer, coupling the capacitor to, for example, a plateline 867. The contact may be formed using conventional damascene techniques. Dual damascene techniques or a combination of damascene and RIE techniques can also be used to form the contact and conductive line.

In an alternative embodiment, an additional barrier layer is formed prior to the first barrier layer 582 (See FIG. 5). This additional barrier layer serves to promote adhesion between the first barrier layer and prevent diffusion of plug materials upward to the capacitor. In one embodiment, the additional barrier layer comprises Ti. Other materials, such as TiN, TaN, TaSiN or TiAlN, are also useful. The two barrier layers can be patterned together or separately so that the first barrier layer completely covers the additional barrier layer, including the sidewalls. The process continues as described from FIG. 6 onwards.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit having a capacitor over plug structure comprising:

a semiconductor substrate having a dielectric layer formed on its surface;

an adhesion layer on the surface of the dielectric layer;

a plug formed on the dielectric layer, the plug surface is coplanar with the surface of the adhesion layer;

a capacitor formed over the adhesion layer in contact with the plug; and first and second conductive barrier layers between the capacitor and adhesion layer, the first conductive layer in contact with the adhesion layer and plug, the second barrier layer covering a top surface and sidewalls of the first barrier layer and is in contact with the adhesion layer and capacitor.

2. The integrated circuit of claim 1 wherein the capacitor comprises a ferroelectric capacitor.

3. The integrated circuit of claim 1 wherein the capacitor comprises a high k dielectric capacitor.

4. The integrated circuit of claim 1 or 2 wherein the adhesion layer comprises a non-conductive material.

5. The integrated circuit of claim 4 wherein the first conductive barrier layer comprises Ir.

6. The integrated circuit of claim 5 wherein the second conductive barrier layer comprises a conductive oxide.

7. The integrated circuit of claim 6 wherein the conductive oxide comprises iridium oxide.

8. The integrated circuit of claim 4 wherein the second conductive barrier layer comprises a conductive oxide.

9. The integrated circuit of claim 4 wherein the conductive oxide comprises iridium oxide.

10. The integrated circuit of claim 4 wherein the first conductive barrier layer comprises a material selected from Pd, Rh, and Hf.

11. The integrated circuit of claim 10 wherein the second conductive barrier layer comprises a conductive oxide.

12. The integrated circuit of claim 11 wherein the conductive oxide comprises iridium oxide.

13. The integrated circuit of claim 4 further comprises a third conductive barrier layer, the third conductive barrier layer disposed below the first barrier layer.

14. The integrated circuit of claim 13 wherein the third barrier layer comprises titanium.

15. The integrated circuit of claim 13 wherein the third barrier layer comprises a material selected from the group consisting of TiN, TaN, TaSiN, and TiAlN.

16. The integrated circuit of claim 13 wherein the first barrier layer covers a top surface and sidewalls of the third barrier layer.

17. The integrated circuit of claim 16 wherein the third barrier layer comprises titanium.

18. The integrated circuit of claim 16 wherein the third barrier layer comprises a material selected from the group consisting of TiN, TaN, TaSiN, and TiAlN.

19. The integrated circuit of claim 6 further comprises a third conductive barrier layer, the third conductive barrier layer disposed below the first barrier layer.

20. The integrated circuit of claim 19 wherein the third barrier layer comprises titanium.

21. The integrated circuit of claim 19 wherein the third barrier layer comprises a material selected from the group consisting of TiN, TaN, TaSiN, and TiAlN.

22. The integrated circuit of claim 19 wherein the first barrier layer covers a top surface and sidewalls of the third barrier layer.

23. The integrated circuit of claim 22 wherein the third barrier layer comprises titanium.

24. The integrated circuit of claim 22 wherein the third barrier layer comprises a material selected from the group consisting of TiN, TaN, TaSiN, and TiAlN.

* * * * *